United States Patent
Teraguchi

(10) Patent No.: US 7,468,524 B2
(45) Date of Patent: *Dec. 23, 2008

(54) FIELD-EFFECT TRANSISTOR

(75) Inventor: Nobuaki Teraguchi, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 23 days.

This patent is subject to a terminal disclaimer.

(21) Appl. No.: 11/411,279

(22) Filed: Apr. 25, 2006

(65) Prior Publication Data

US 2006/0237711 A1 Oct. 26, 2006

(30) Foreign Application Priority Data

Apr. 26, 2005 (JP) ............................. 2005-128241
Feb. 17, 2006 (JP) ............................. 2006-041138

(51) Int. Cl.
*H01L 29/778* (2006.01)

(52) U.S. Cl. ..................... 257/27; 257/192; 257/194; 257/E29.188; 257/E29.246; 257/14

(58) Field of Classification Search .................. 257/14, 257/192, 194, 27, E29.188, E29.246, E29.104
See application file for complete search history.

(56) References Cited

U.S. PATENT DOCUMENTS 5,192,987 A  3/1993  Khan et al.

2005/0145883 A1 *  7/2005  Beach et al. ................. 257/194
2007/0272969 A1 * 11/2007  Teraguchi .................... 257/315

FOREIGN PATENT DOCUMENTS

JP    2002-064201 A    2/2002

OTHER PUBLICATIONS

Ohmi, device characterization of high electron mobility transistors with ferroelectric gate structures, IEEE. 163-166, 1996.*
Hansen, AlGaN/GaN metal oxide semiconductor heterostructure field effect transistors using barium strontium titanite, J. Vac. Sci. Tech. B 22, 2479-2485, 2004.*
Han, J. et al. (2000). "MOVPE Growth of Quaternary (Al,Ga,In)N for UV Optoelectronics" Proceedings from Materials Research Sciences Symposium *In GaN and Related Alloys*—1999, Myers, T.H. et al. eds., vol. 595, pp. W6.2.1-W6.2.12.

* cited by examiner

*Primary Examiner*—Minh-Loan T Tran
*Assistant Examiner*—Minchul Yang
(74) *Attorney, Agent, or Firm*—Morrison & Foerster LLP

(57) ABSTRACT

A nitride-based group III-V compound semiconductor device includes a buffer layer, a first nitride semiconductor layer and a second nitride semiconductor layer successively stacked on a substrate, the first and the second nitride layers having their respective lattice constants $a_1$ and $a_2$ in the relation $a_1 > a_2$, an ohmic source electrode and an ohmic drain electrode formed on the second nitride layer, and a piezoelectric effect film formed on at least a partial region between the electrodes, wherein the piezoelectric film exerts compressive stress of an absolute magnitude at least equivalent to that of tensile stress applied to the second nitride layer due to the difference ($a_1 - a_2$) between the lattice constants of the first and second nitride layers.

21 Claims, 4 Drawing Sheets

FIELD-EFFECT TRANSISTOR

This nonprovisional application is based on Japanese Patent Applications Nos. 2005-128241 and 2006-041138 filed with the Japan Patent Office on Apr. 26, 2005 and Feb. 17, 2006, respectively, the entire contents of which are hereby incorporated by reference.

BACKGROUND OF THE INVENTION

1. Field of the Invention

The present invention relates to a field-effect transistor (FET) composed of nitride-based group III-V compound semiconductors, and more particularly relates to a normally-off field-effect transistor.

2. Description of the Background Art

A conventional field-effect transistor employing nitride-based group III-V compound semiconductors includes a GaN layer and an AlGaN layer stacked with each other on a substrate (refer to U.S. Pat. No. 5,192,987). The AlGaN layer has a smaller lattice constant as compared with the GaN layer.

A field-effect transistor employing nitride-based group III-V semiconductors includes a hetero-structure of AlGaN/GaN, for example. In formation of this hetero-structure, a thin AlGaN layer having a thickness of 20 nm, for example, is epitaxially grown on a relatively thick GaN layer having a thickness of 1 μm, for example. The AlGaN layer, having a smaller lattice constant $a_{AlGaN}$ as compared with a lattice constant $a_{GaN}$ of the GaN layer ($a_{GaN} > a_{AlGaN}$), receives tensile stress from the GaN layer. Interfacial local energy levels formed at the AlGaN/GaN interface on the side of the GaN layer having a relatively small band gap confines piezoelectric charge induced by the tensile stress and charge resulting from spontaneous polarization specific to the nitride semiconductors having a wurtzite structure, thereby automatically generating two-dimensional electron gas.

In other words, even when the gate voltage is zero in the field-effect transistor including the hetero-structure, a region (channel region) where electrons are present is created and then electrons can flow through the channel region. Therefore, such a transistor is referred to as a normally-on transistor.

A graph of FIG. 4 schematically illustrates exemplary static characteristics in such a normally-on FET. In this graph, a horizontal axis represents the source-to-drain voltage $V_{DS}$, and a vertical axis represents the drain current $I_D$. As seen in FIG. 4, even when the gate voltage Vg is zero, the drain current $I_D$ flows upon application of the voltage $V_{DS}$ between a source and a drain.

In consideration of application to a general circuit, a normally-off FET is more preferable, in which the current $I_D$ does not flow when the gate voltage Vg is zero. The reason of this is that even when some trouble occurs in the circuit, overcurrent does not flow between the source and drain of the normally-off FET unless the voltage Vg is applied to the gate, and thus there is much less possibility that the semiconductor device including the FET breaks down. If the gate voltage Vg is reduced to zero for some cause in a normally-on FET, on the other hand, overcurrent can flow between the source and drain, and there is a possibility that the transistor itself breaks down.

A MOS (metal-oxide-semiconductor) FET employing Si can be formed as a normally-off FET. When the gate voltage Vg is zero in the MOSFET employing Si, the drain current $I_D$ does not flow irrespective of application of the voltage $V_{DS}$ between the source and drain, as seen in a graph of FIG. 5 similar to FIG. 4.

In an n-type MOSFET employing Si, an n-type source region and an n-type drain region are formed at a small interval on a p-type Si substrate. A similar structure is theoretically formable also by using a GaN substrate. In the case of GaN, however, it is not easy to form a high-quality p-type layer and it is very difficult to form an n-type region within a p-type layer by ion implantation or diffusion, dissimilarly to the case of Si. Therefore, a MOSFET including no hetero-structure (e.g., GaN-MOSFET) has not yet been put into practice. While there is a MOSFET including an AlGaN/GaN hetero-structure (i.e., MOS-HFET), this is a normally-on FET.

When a normally-off FET is formed with GaN, a short switching time can be expected due to higher electron mobility in GaN as compared with Si, and power loss of the transistor can be remarkably improved to ⅕ to ⅒, thereby to enable energy saving and downsizing of an electronic device.

As described before, however, it is difficult to prepare a normally-off field-effect transistor including a hetero-structure.

SUMMARY OF THE INVENTION

Accordingly, a principal object of the present invention is to provide a normally-off field-effect transistor including a hetero-structure.

The inventors have made deep study and found out a method capable of implementing a normally-off field-effect transistor including a hetero-structure.

A field-effect transistor according to an aspect of the present invention includes a first nitride semiconductor layer having a lattice constant $a_1$ and a band gap $Eg_1$; a second nitride semiconductor layer, stacked on the first nitride semiconductor layer, having a lattice constant $a_2$ and a band gap $Eg_2$; a source electrode and a drain electrode formed on the second nitride semiconductor layer; a piezoelectric effect film formed on the second nitride semiconductor layer in at least a partial region between the source and drain electrodes; and a gate electrode formed on at least a partial region of the piezoelectric effect film; wherein lattice constants $a_1$ and $a_2$ are in the relation $a_1 > a_2$; band gaps $Eg_1$ and $Eg_2$ are in the relation $Eg_1 < Eg_2$; and the piezoelectric film exerts compressive stress on the second nitride semiconductor layer so as not to allow current flow between the source and drain electrodes when no gate voltage is applied, and cancels the compressive stress so as to allow current flow between the source and drain electrodes when gate voltage is applied.

A field-effect transistor according to another aspect of the present invention includes a first nitride semiconductor layer having a lattice constant $a_1$ and a band gap $Eg_1$; a second nitride semiconductor layer, stacked on the first nitride semiconductor layer, having a lattice constant $a_2$ and a band gap $Eg_2$; a source electrode and a drain electrode formed on the second nitride semiconductor layer; a piezoelectric effect film formed on the second nitride semiconductor layer in at least a partial region between the source and drain electrodes; and a gate electrode formed on at least a partial region of the piezoelectric effect film, wherein lattice constants $a_1$ and $a_2$ are in the relation $a_1 < a_2$; band gaps $Eg_1$ and $Eg_2$ are in the relation $Eg_1 > Eg_2$; and the piezoelectric film exerts tensile stress on the second nitride semiconductor layer so as not to allow current flow between the source and drain electrodes when no gate voltage is applied, and cancels the tensile stress so as to allow current flow between the source and drain electrodes when the gate voltage is applied.

A field-effect transistor according to still another aspect of the present invention includes a buffer layer, a first nitride semiconductor layer and a second nitride semiconductor layer successively formed on a substrate, wherein the first and second nitride semiconductor layers have their respective lattice constants $a_1$ and $a_2$ in the relation $a_1>a_2$; an ohmic source electrode and an ohmic drain electrode are formed on the second nitride semiconductor layer; a piezoelectric effect film is formed on at least a partial region between the source and drain electrodes; and the piezoelectric effect film exerts compressive stress of an absolute magnitude at least equivalent to that of tensile stress applied to the second nitride semiconductor layer due to the difference $(a_1-a_2)$ between the lattice constants of the first and second nitride layers.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 6:
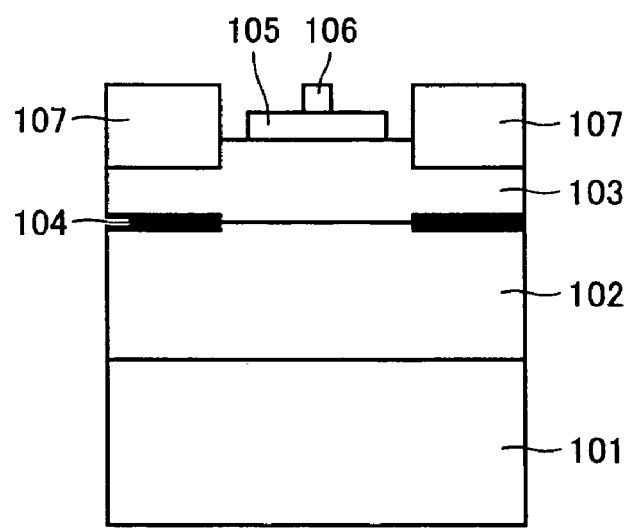
FIG. 6 is a schematic sectional view for illustrating effects of an FET including a hetero-structure according to the present invention.

A schematic sectional view of FIG. 6 illustrates functions and effects of an exemplary field-effect transistor according to the present invention. In this figure, first and second nitride semiconductor layers serving as a channel layer 102 and a barrier layer 103, respectively, are stacked on a substrate 101. Ohmic source and drain electrodes 107 are formed on barrier layer 103, and a piezoelectric effect film 105 is formed on a partial or entire region therebetween. A gate electrode 106 is formed on piezoelectric effect film 105.

In the exemplary field-effect transistor according to the present invention, first and second semiconductor layers 102 and 103 has their respective lattice constants $a_1$ and $a_2$ in the relation $a_1>a_2$ that corresponds to the relation $a_{GaN}>a_{AlGaN}$ in the conventional FET. In the field-effect transistor of FIG. 6, first and second nitride semiconductor layers 102 and 103 satisfy the aforementioned relation $a_1>a_2$, for example, and have their respective band gaps $Eg_1$ and $Eg_2$ satisfying the relation $Eg_1<Eg_2$, for automatically generating two-dimensional electron gas in the vicinity of the hetero-interface on the side of first nitride semiconductor layer 102. In other words, the hetero-structure in the FET of FIG. 6 is basically identical to that of the conventional normally-on FET.

In the exemplary field-effect transistor of FIG. 6, however, piezoelectric effect film 105 is formed on at least a partial region between source and drain electrodes 107. This piezoelectric effect film 105 applies compressive stress to barrier layer 103 so as to cancel tensile stress applied from channel layer 102 to hetero barrier layer 103. Due to this, no two-dimensional electron gas is present immediately under the region between source and drain electrodes 107, while two-dimensional electron gas 104 is kept immediately under source and drain electrodes 107, thereby making it possible to obtain a normally-off FET.

When voltage is applied to piezoelectric effect film 105 so as to cancel the compressive stress exerted on second nitride semiconductor layer 103, electrons are induced on the hetero-interface located immediately under source and drain electrodes 107. In other words, two-dimensional electron gas 104 is formed on the hetero-interface located immediately under source and drain electrodes 107, thereby rendering the FET operable.

In this FET according to the present invention, density of two-dimensional electron gas 104 generated immediately under source and drain electrodes 107 can be so increased as to realize small contact resistance between source and drain electrodes 107. Further, the FET according to the present invention can maintain its normally-off state and also can feed large current in its on-state because it has large potential two-dimensional electron gas density.

Oxides having the perovskite structure can preferably be used for a film having piezoelectric effect. While some kinds of materials have piezoelectric effect, oxides having the perovskite structure exhibit large piezoelectric effect and thus enable efficient control of the channel. More specifically, $BaTiO_3$, $(Pb,La)(Zr,Ti)O_3$, $SrBi_2Ta_2O_9$, $Bi_4Ti_3O_9$, $LiNbO_3$, $Sr_2Nb_2O_7$ and the like can be employed as the oxides having the perovskite structure. These oxides have as large piezoelectric effect as applicable to an FeRAM (ferroelectric random-access memory) and can efficiently convert applied voltage to crystal displacement.

Fluorides having the fluorite structure can also preferably be used for a film having piezoelectric effect. In other words, there are materials exhibiting piezoelectric effect other than the oxides having the perovskite structure, and it is also possible to use $BaMgF_4$ and $BaMnF_4$, for example.

A sputtering method can preferably be used as a method of forming a film having piezoelectric effect. With the sputtering method, direction and/or level of internal stress (i.e., tensile stress level or compressive stress level) of a film to be deposited can be varied depending on deposition conditions. More specifically, internal stress of a piezoelectric effect film constrained by an underlayer becomes compressive (the film itself tends to expand) in the case that the atmospheric gas pressure of sputtering is high, while the internal pressure becomes tensile (the film itself tends to shrink) in the case that the atmospheric gas pressure of sputtering is low.

Referring to FIG. 6, for example, tensile stress applied from first nitride semiconductor layer 102 to second nitride semiconductor layer 103 (stress for expanding second nitride semiconductor layer 103) can be canceled by forming piezoelectric film 105 with sputtering at an atmospheric gas pressure of less than about 1 Pa. In other words, tensile stress included as internal stress in piezoelectric effect film 105 (this film tends to shrink) exerts compressive stress on (acts to compress) second nitride semiconductor layer 103, thereby canceling tensile stress applied from first nitride semiconductor layer 102 to second nitride semiconductor layer 103.

Embodiment 1

Figure 1:
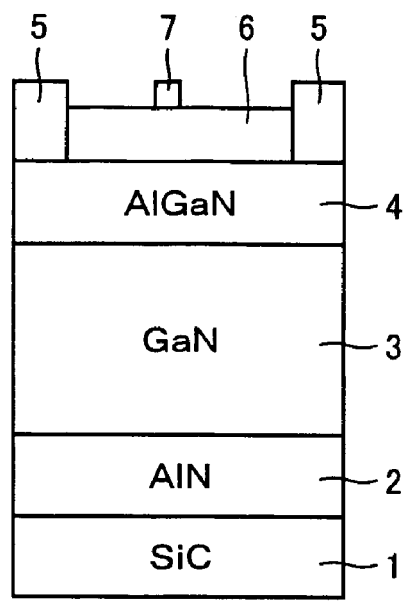
FIG. 1 is a schematic sectional view showing a structure of an FET according to an embodiment of the present invention.

FIG. 1 is a schematic sectional view showing a heterojunction FET according to Embodiment 1 of the present invention. In order to prepare this FET, an AlN buffer layer 2 having a thickness of 20 nm is grown on an Si atomic plane of an SiC substrate 1 by MOCVD (metal organic chemical vapor deposition) at a substrate temperature of 1200° C. Then, a GaN channel layer 3 having a lattice constant a=3.189 Å and a band gap Eg=3.42 eV is grown to a thickness of 3 μm on AlN buffer layer 2 at a substrate temperature of 1100° C. Then, an $Al_{0.3}Ga_{0.7}N$ barrier layer 4 having a lattice constant a=3.166 Å and a band gap Eg=4.02 eV is grown to a thickness of 20 nm on GaN channel layer 3 at a substrate temperature of 1100° C.

Thereafter, in order to form source and drain electrodes 5a, a resist film is patterned by photolithography; a multilayer metal film is deposited including Hf (10 nm thickness)/Al (100 nm thickness)/Hf(40 nm thickness)/Au(240 nm thickness) layers stacked in this order; lifting-off is carried out; and then heat-treatment at 825° C. for 30 seconds is carried out. Further, a $BaTiO_3$ film 6 serving as a piezoelectric effect film is deposited to a 500 nm thickness in a region other than source and drain electrodes 5 on $Al_{0.3}Ga_{0.7}N$ barrier layer 4 by sputtering at a room temperature. For this sputtering, it is possible to use reactive sputtering with a $BaTiO_3$ target in plasma of a mixture of Ar and $O_2$. The sputtering pressure can be set to 0.5 Pa, for example, in order to obtain internal tensile stress in $BaTiO_3$ film 6. Then, an Au gate electrode 7 is formed on $BaTiO_3$ film 6.

Figure 2:
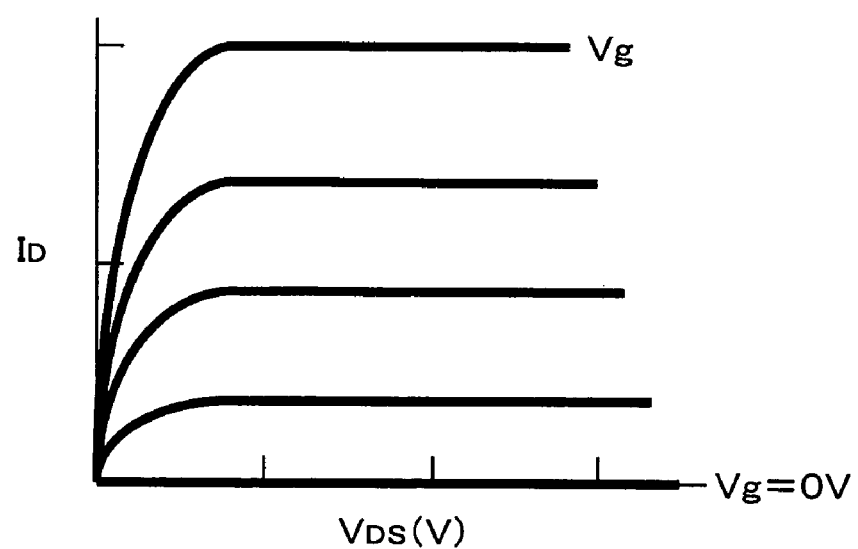
FIG. 2 is a schematic graph showing current-voltage characteristics ($I_D$-$V_{DS}$) of the FET of FIG. 1.

FIG. 2 is a schematic graph showing the current-voltage characteristics of the FET prepared in the aforementioned manner. In this graph, a horizontal axis represents the source-to-drain voltage $V_{DS}$, and a vertical axis represents the drain current $I_D$. In the hetero-junction FET according to Embodiment 1, no drain current $I_D$ flows ($I_D$=0) when the gate voltage Vg is zero as seen in FIG. 2, and this means that a normally-off FET is obtained.

Embodiment 2

Figure 3:
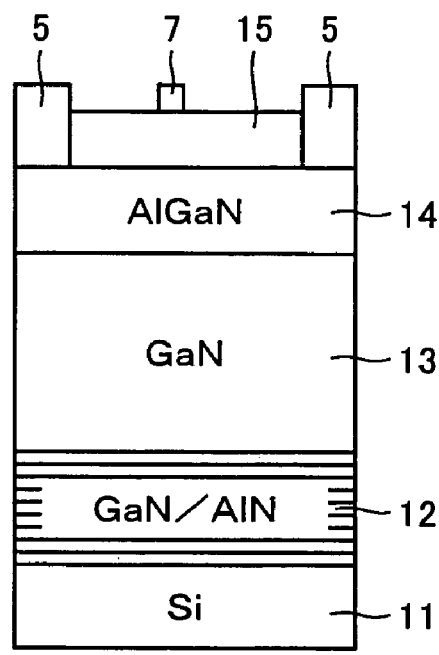
FIG. 3 is a schematic sectional view showing a structure of an FET according to another embodiment of the present invention.
Figure 4:
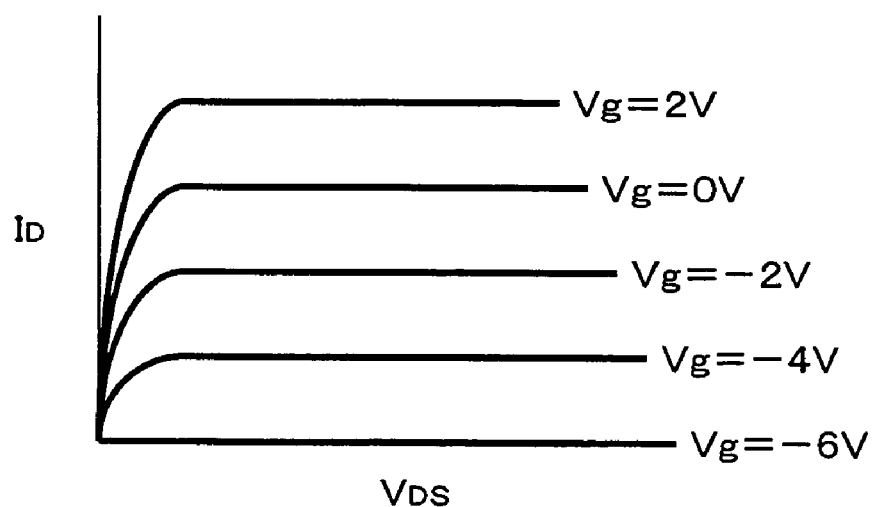
FIG. 4 is a schematic graph showing $I_D$-$V_{DS}$ characteristics of a conventional normally-on FET including a hetero-structure.
Figure 5:
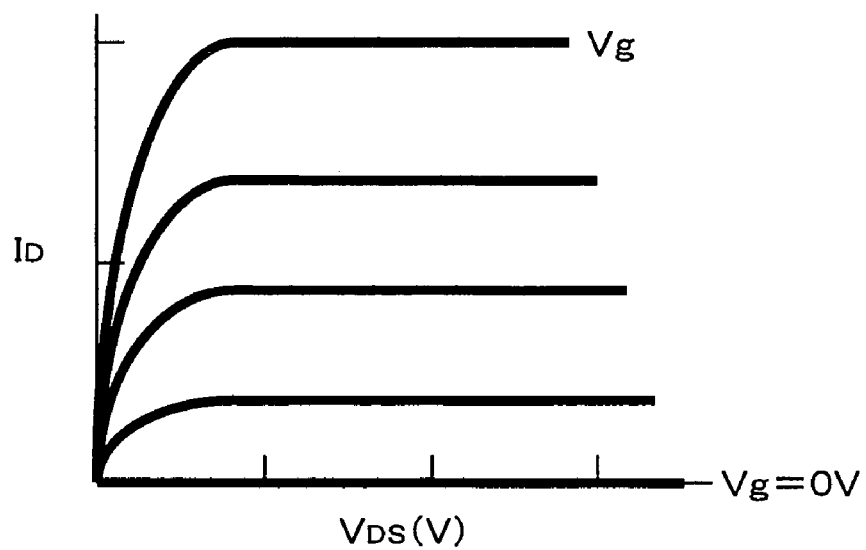
FIG. 5 is a schematic graph showing $I_D$-$V_{DS}$ characteristics of a conventional normally-off FET formed by using Si.

FIG. 3 is a schematic sectional view showing a structure of an FET including a hetero-structure according to Embodiment 2 of the present invention. In this FET, an Si substrate 11 is used for depositing an AlN/GaN multilayer film as a buffer layer 12, growing a GaN layer of 1 μm thickness having a lattice constant a=3.189 Å and a band gap Eg=3.42 eV as a channel layer 13 at a substrate temperature of 1000° C., and growing an $Al_{0.2}Ga_{0.8}N$ layer of 30 nm thickness having a lattice constant a=3.174 Å and a band gap Eg=3.80 eV as a barrier layer 14 at a substrate temperature of 1100° C. When an AlN layer or a GaN layer is grown on Si substrate 11, an Al atomic plane or a Ga atomic plane appears on its upper surface (the side on which electrodes are to be formed).

An oxide film or a fluoride film serving as a piezoelectric effect film 15 can be deposited by sputtering also in Embodiment 2, similarly as in the case of Example 1. The sputtering can be carried out by using Ar and $O_2$ (Ar:$O_2$=1:1) to deposit the oxide film, and by using only Ar to deposit the fluoride film. The sputtering pressure can be set to a constant value of 0.5 Pa, for example. Thickness of the oxide or fluoride film can be set to 1 μm, for example.

Since internal stress level of oxide or fluoride film 15 is varied depending on the sputtering pressure, it is also possible to properly vary the thickness of this film 15. In other words, the thickness of piezoelectric effect film 15 is not restricted to the aforementioned value.

Embodiment 3

Figure 7:
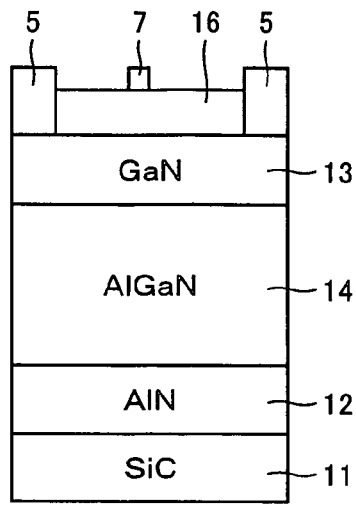
FIG. 7 is a schematic sectional view showing a structure of an FET according to a further embodiment of the present invention.

FIG. 7 is a schematic sectional view showing a structure of an FET including a hetero-structure according to Embodiment 3 of the present invention. While the GaN layer and the AlGaN barrier layer are so stacked that a Ga atomic plane of each of the layers appears on the upper surface (the side on which electrodes are to be formed) in each of the aforementioned Embodiments 1 and 2, a GaN layer 13 and an AlGaN layer 14 can alternatively be so stacked that an N atomic plane of each of the layers appears on the upper surfaces (the side on which electrodes are to be formed) as in this Embodiment 3.

In this case, a buffer layer 12 of AlN, a first semiconductor layer 14 of AlGaN and a second semiconductor layer 13 of GaN are stacked in this order on a C atomic plane of an SiC substrate 11, as shown in FIG. 7. At this time, AlGaN layer 14 and GaN layer 13 have their respective lattice constants $a_1$ and $a_2$ in the relation $a_1 < a_2$ (i.e., the lattice constant $a_1$ of AlGaN is reduced below the lattice constant $a_2$ of GaN as the composition ratio of Al is increased), and thus second semiconductor layer 13 of GaN includes its internal compressive stress, in contrast to the cases of Embodiments 1 and 2. In this case, therefore, a piezoelectric effect film 16 having its internal compressive stress may be deposited by sputtering under a gas pressure of 2 Pa, for example. Since layers 13 and 14 are so stacked that an N atomic plane of each of the layers appears on the upper surface as described above, the polarization direction is identical to that in Examples 1 and 2, and thus two-dimensional electron gas is generated at the interface between AlGaN layer 14 and GaN layer 13.

In other words, generation of the two-dimensional electron gas can be suppressed in a state of no application of the gate voltage by providing piezoelectric effect film 16 having its internal compressive stress that acts to make internal compressive stress disappear in GaN layer 13, whereby a normally-off FET can be obtained. Incidentally, in the case that piezoelectric effect film 16 is not present, withstanding voltage of the FET regarding the gate voltage is reduced due to the band gap of GaN smaller than that of AlGaN. When insulating piezoelectric effect film 16 is inserted between GaN layer 13 and a gate electrode 7 as shown in FIG. 7, however, it is possible to obtain a normally-off FET having high withstanding voltage regarding the gate voltage.

Other Examples

It is also possible to obtain a normally-off FET by using $Al_xGa_{1-x-y}In_yN$ (0≦x≦1, 0≦y≦1) layers having properly selected composition ratios in place of the AlGaN layer or the GaN layer in each of the aforementioned Embodiments 1 to 3. In other words, an $Al_xGa_{1-x-y}In_yN$ layer having a lattice constant and a band gap suitable for a channel layer or a barrier layer can be selectively set by properly selecting the composition ratios of Al, Ga and In. In general, $Al_xGa_{1-x-y}In_yN$ has such a tendency that the band gap is increased and the lattice constant is reduced when the Al composition ratio is increased, while the band gap is reduced and the lattice constant is increased when the In composition ratio is increased.

Figure 8:
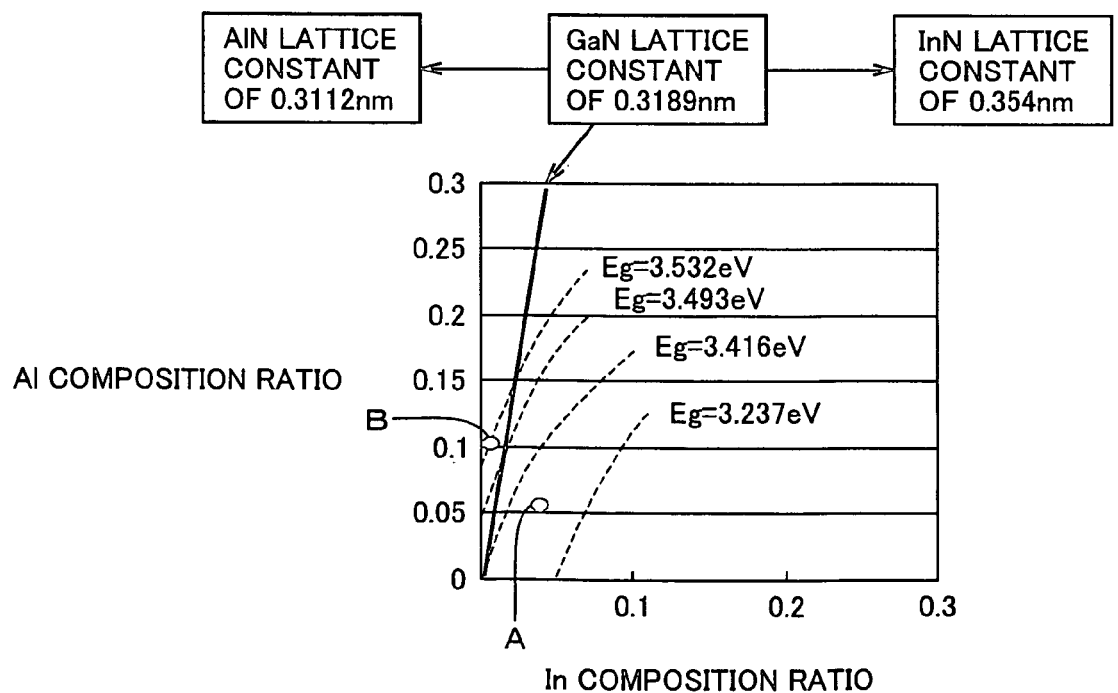
FIG. 8 is a graph showing the lattice constant and the band gap depending on the composition ratios of In and Al in AlGaInN, according to the prior art.

In connection with this, in a graph shown in FIG. 8 (cited from MATERIALS RESEARCH SOCIETY SYMPOSIUM PROCEEDING, Vol. 595, GaN and Related Alloys-1999, W6.2.7), a horizontal axis represents the In composition ratio in AlGaInN and a vertical axis represents the Al composition ratio in AlGaInN. In this graph, a thick solid oblique line indicates the In and Al composition ratios in AlGaInN for obtaining the same lattice constant as that of GaN. In other words, AlGaInN has a lattice constant larger than that of GaN when having the In and Al composition ratios on the right side of the solid oblique line, while has a lattice constant smaller than that of GaN when having the In and Al composition ratios on the left side of the solid oblique line. Furthermore, in the graph, curved broken-lines show variations of the band gaps depending on the In and Al composition ratios in AlGaInN.

When having the composition ratios at a point A in FIG. 8, for example, AlGaInN has a band gap smaller than that of GaN (Eg=3.42 eV) and a lattice constant larger than that of GaN (a=3.189). When having the composition ratios at another point B in FIG. 8, on the other hand, AlGaInN has a larger band gap than that of GaN and a smaller lattice constant than that of GaN. Therefore, an AlGaInN layer having the composition ratios at the point A can be used in place of the GaN layer, and an AlGaInN layer having the composition ratios at the point B can be used in place of the AlGaN layer, for example.

According to the present invention, as hereinabove described, a normally-off hetero-structure field-effect transistor can be provided by utilizing a piezoelectric effect film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field-effect transistor comprising:
   a first nitride semiconductor layer having a lattice constant $a_1$ and a band gap $Eg_1$;
   a second nitride semiconductor layer, stacked on said first nitride semiconductor layer, having a lattice constant $a_2$ and a band gap $Eg_2$;
   a source electrode and a drain electrode formed on said second nitride semiconductor layer;
   a piezoelectric effect film having a thickness of more than 500 nm formed on said second nitride semiconductor layer in at least a partial region between said source electrode and said drain electrode; and
   a gate electrode formed on at least a partial region of said piezoelectric effect film, wherein
   said lattice constants $a_1$ and $a_2$ are in the relation $a_1 > a_2$,
   said band gaps $Eg_1$ and $Eg_2$ are in the relation $Eg_1 < Eg_2$, and
   said piezoelectric film exerts compressive stress on said second nitride semiconductor layer so as not to allow current flow between said source electrode and said drain electrode when no gate voltage is applied, and cancels said compressive stress so as to allow current flow between said source electrode and said drain electrode when the gate voltage is applied.

2. The field-effect transistor according to claim 1, wherein said piezoelectric effect film is formed of an oxide having a perovskite structure.

3. The field-effect transistor according to claim 2, wherein said oxide having a perovskite structure is one of an oxide containing at least Ba and Ti, an oxide containing at least Pb, La, Zr and Ti, an oxide containing at least Sr, Bi and Ta, an oxide containing at least Bi and Ti, an oxide containing at least Li and Nb and an oxide containing at least Sr and Nb.

4. The field-effect transistor according to claim 1, wherein said piezoelectric effect film is formed of a fluoride having a fluorite structure.

5. The field-effect transistor according to claim 4, wherein said fluoride having a fluorite structure is a fluoride containing at least Ba and Mg or a fluoride containing at least Ba and Mn.

6. The field-effect transistor according to claim 1, wherein said piezoelectric effect film is deposited by sputtering.

7. The field-effect transistor according to claim 6, wherein said piezoelectric effect film is deposited by sputtering under an atmospheric gas pressure of less than 1 Pa.

8. A field-effect transistor including:
   a first nitride semiconductor layer having a lattice constant $a_1$ and a band gap $Eg_1$;
   a second nitride semiconductor layer, stacked on said first nitride semiconductor layer, having a lattice constant $a_2$ and a band gap $Eg_2$;
   a source electrode and a drain electrode formed on said second nitride semiconductor layer;
   a piezoelectric effect film having a thickness of more than 500 nm formed on said second nitride semiconductor layer in at least a partial region between said source electrode and said drain electrode; and
   a gate electrode formed on at least a partial region of said piezoelectric effect film, wherein
   said lattice constants $a_1$ and $a_2$ are in the relation $a_1 < a_2$,
   said band gaps $Eg_1$ and $Eg_2$ are in the relation $Eg_1 > Eg_2$, and
   said piezoelectric film exerts tensile stress on said second nitride semiconductor layer so as not to allow current flow between said source electrode and said drain electrode when no gate voltage is applied, and cancels said tensile stress so as to allow current flow between said source electrode and said drain electrode when the gate voltage is applied.

9. The field-effect transistor according to claim 8, wherein said piezoelectric effect film is formed of an oxide having a perovskite structure.

10. The field-effect transistor according to claim 9, wherein said oxide having a perovskite structure is one of an oxide containing at least Ba and Ti, an oxide containing at least Pb, La, Zr and Ti, an oxide containing at least Sr, Bi and Ta, an oxide containing at least Bi and Ti, an oxide containing at least Li and Nb and an oxide containing at least Sr and Nb.

11. The field-effect transistor according to claim 8, wherein said piezoelectric effect film is formed of a fluoride having a fluorite structure.

12. The field-effect transistor according to claim 11, wherein said fluoride having a fluorite structure is a fluoride containing at least Ba and Mg or a fluoride containing at least Ba and Mn.

13. The field-effect transistor according to claim 8, wherein said piezoelectric effect film is deposited by sputtering.

14. The field-effect transistor according to claim 13, wherein said piezoelectric effect film is deposited by sputtering under an atmospheric gas pressure larger than 1 Pa.

15. A field-effect transistor including a buffer layer, a first nitride semiconductor layer and a second nitride semiconductor layer successively stacked on a substrate, wherein
   said first and said second nitride layers have their respective lattice constants $a_1$ and $a_2$ in the relation $a_1 > a_2$,
   an ohmic source electrode and an ohmic drain electrode are formed on said second nitride semiconductor layer while a piezoelectric effect film having a thickness of more than 500 nm is formed on at least a partial region between said source and said drain electrodes, and
   said piezoelectric effect film exerts compressive stress of an absolute magnitude at least equivalent to that of tensile stress applied to said second nitride semiconductor layer due to the difference $(a_1 - a_2)$ between said lattice constants of said first and second nitride layers.

16. The field-effect transistor according to claim 15, wherein
said piezoelectric field film is formed of an oxide having a perovskite structure.

17. The field-effect transistor according to claim 16, wherein
said oxide having a perovskite structure is one of an oxide containing at least Ba and Ti, an oxide containing at least Pb, La, Zr and Ti, an oxide containing at least Sr, Bi and Ta, an oxide containing at least Bi and Ti, an oxide containing at least Li and Nb and an oxide containing at least Sr and Nb.

18. The field-effect transistor according to claim 15, wherein
said piezoelectric effect film is formed of a fluoride having a fluorite structure.

19. The field-effect transistor according to claim 18, wherein
said fluoride having a fluorite structure is a fluoride containing at least Ba and Mg or a fluoride containing at least Ba and Mn.

20. The field-effect transistor according to claim 15, wherein
said piezoelectric effect film is deposited by sputtering.

21. The field-effect transistor according to claim 20, wherein
said piezoelectric effect film is deposited by sputtering under an atmospheric gas pressure of less than 1 Pa.

* * * * *